US009620410B1

(12) United States Patent
Wagner et al.

(10) Patent No.: US 9,620,410 B1
(45) Date of Patent: *Apr. 11, 2017

(54) METHODS FOR PREVENTING PRECIPITATION OF ETCH BYPRODUCTS DURING AN ETCH PROCESS AND/OR SUBSEQUENT RINSE PROCESS

(75) Inventors: Mark I. Wagner, Austin, TX (US); James P. DeYoung, Dallas, TX (US)

(73) Assignee: Lam Research Corporation, Fremont, CA (US)

(*) Notice: Subject to any disclaimer, the term of this patent is extended or adjusted under 35 U.S.C. 154(b) by 657 days.

This patent is subject to a terminal disclaimer.

(21) Appl. No.: 12/356,170

(22) Filed: Jan. 20, 2009

(51) Int. Cl.
*H01L 21/768* (2006.01)
*H01L 21/02* (2006.01)

(52) U.S. Cl.
CPC .. *H01L 21/76814* (2013.01); *H01L 21/02068* (2013.01); *H01L 21/02101* (2013.01)

(58) Field of Classification Search
USPC ........................................................ 438/706
See application file for complete search history.

(56) References Cited

U.S. PATENT DOCUMENTS

| 4,948,685 | A | 8/1990 | Ohsawa et al. |
| 5,962,743 | A | 10/1999 | Gruber et al. |
| 6,100,203 | A | 8/2000 | Kil et al. |
| 6,306,754 | B1 * | 10/2001 | Agarwal ........................ 438/619 |
| 6,562,146 | B1 * | 5/2003 | DeYoung .............. B08B 7/0021 134/2 |
| 6,596,093 | B2 | 7/2003 | DeYoung et al. |
| 6,602,351 | B2 | 8/2003 | DeYoung et al. |
| 6,613,157 | B2 | 9/2003 | DeYoung et al. |

(Continued)

FOREIGN PATENT DOCUMENTS

| CN | 1666323 | 9/2005 |
| JP | 2005-183749 A | 7/2005 |

(Continued)

OTHER PUBLICATIONS

McClain et. al. Design of nonionic Surfactants for Supercritical Carbon Dioxied, Dec. 20, 1996, Science, vol. 274, p. 2049-2052.*

(Continued)

*Primary Examiner* — Duy Deo
*Assistant Examiner* — Erin Bergner
(74) *Attorney, Agent, or Firm* — Beyer Law Group LLP

(57) ABSTRACT

Methods for processing a microelectronic topography include selectively etching a layer of the topography using an etch solution which includes a fluid in a supercritical or liquid state. In some embodiments, the etch process may include introducing a fresh composition of the etch solution into a process chamber while simultaneously venting the chamber to inhibit the precipitation of etch byproducts. A rinse solution including the fluid in a supercritical or liquid state may be introduced into the chamber subsequent to the etch process. In some cases, the rinse solution may include one or more polar cosolvents, such as acids, polar alcohols, and/or water mixed with the fluid to help inhibit etch byproduct precipitation. In addition or alternatively, at least one of the etch solution and rinse solution may include a chemistry which is configured to modify dissolved etch byproducts within an ambient of the topography to inhibit etch byproduct precipitation.

20 Claims, 2 Drawing Sheets

(56) References Cited

U.S. PATENT DOCUMENTS

| | | | |
|---|---|---|---|
| 6,641,678 B2 | 11/2003 | DeYoung et al. | |
| 6,669,785 B2 | 12/2003 | DeYoung et al. | |
| 6,734,112 B2 | 5/2004 | Worm et al. | |
| 6,735,978 B1 | 5/2004 | Tom et al. | |
| 6,740,247 B1 | 5/2004 | Han et al. | |
| 6,763,840 B2 | 7/2004 | DeSimone et al. | |
| 6,764,552 B1* | 7/2004 | Joyce et al. | 134/3 |
| 6,905,555 B2* | 6/2005 | DeYoung et al. | 134/30 |
| 6,953,041 B2 | 10/2005 | DeYoung et al. | |
| 7,011,716 B2 | 3/2006 | Xu et al. | |
| 7,022,655 B2 | 4/2006 | Brask et al. | |
| 7,044,143 B2 | 5/2006 | DeYoung et al. | |
| 7,119,052 B2 | 10/2006 | Korzenski et al. | |
| 7,129,160 B2 | 10/2006 | Chopra | |
| 7,141,496 B2 | 11/2006 | DeYoung et al. | |
| 7,160,815 B2 | 1/2007 | Korzenski et al. | |
| 7,223,352 B2 | 5/2007 | Korzenski et al. | |
| 7,250,374 B2 | 7/2007 | Gale et al. | |
| 7,291,565 B2 | 11/2007 | Hansen et al. | |
| 7,547,635 B2 | 6/2009 | Eppler et al. | |
| 2002/0014257 A1 | 2/2002 | Chandra et al. | |
| 2002/0112740 A1 | 8/2002 | DeYoung et al. | |
| 2002/0112746 A1 | 8/2002 | DeYoung et al. | |
| 2002/0179126 A1 | 12/2002 | DeYoung et al. | |
| 2002/0197761 A1* | 12/2002 | Patel | B81C 1/00476 438/52 |
| 2003/0033676 A1 | 2/2003 | DeYoung et al. | |
| 2003/0216269 A1 | 11/2003 | DeYoung et al. | |
| 2004/0016450 A1 | 1/2004 | Bertram et al. | |
| 2004/0020518 A1 | 2/2004 | DeYoung et al. | |
| 2004/0036102 A1 | 2/2004 | Sell et al. | |
| 2004/0045588 A1 | 3/2004 | DeYoung et al. | |
| 2004/0050406 A1* | 3/2004 | Sehgal | 134/26 |
| 2004/0071873 A1 | 4/2004 | DeYoung et al. | |
| 2005/0028927 A1* | 2/2005 | Basceri et al. | 156/345.1 |
| 2005/0181135 A1 | 8/2005 | Ivanov et al. | |
| 2005/0205515 A1 | 9/2005 | Saga et al. | |
| 2006/0003592 A1 | 1/2006 | Gale et al. | |
| 2006/0019850 A1* | 1/2006 | Korzenski et al. | 510/175 |
| 2006/0180572 A1 | 8/2006 | Jacobson et al. | |
| 2006/0186088 A1 | 8/2006 | Jacobson et al. | |
| 2006/0194404 A1* | 8/2006 | Dupont et al. | 438/397 |
| 2007/0095367 A1 | 5/2007 | Wang et al. | |
| 2007/0221252 A1 | 9/2007 | Kiyose | |
| 2007/0249156 A1* | 10/2007 | Bonilla et al. | 438/622 |
| 2007/0293054 A1 | 12/2007 | Lee et al. | |
| 2008/0241489 A1* | 10/2008 | Ishibashi | G03F 7/11 428/199 |
| 2010/0184301 A1 | 7/2010 | Wagner et al. | |

FOREIGN PATENT DOCUMENTS

| | | |
|---|---|---|
| JP | 2007-142335 A | 6/2007 |
| KR | 2005-0063720 | 6/2005 |
| WO | 2006/113621 | 10/2006 |
| WO | 2006/138505 | 12/2006 |
| WO | 2007/078975 | 7/2007 |

OTHER PUBLICATIONS

Harris et. al. Quantitative Chemical Analysis, Clancy Marshal, 1999, AP14 and AP19.*

Goldfarb et al., "Aqueous-based photoresist drying using supercritical carbon dioxide to prevent pattern collapse," J. Vac. Sci. Technol. B, vol. 18, No. 6, Nov./Dec. 2000, pp. 3313-3317.

U.S. Appl. No. 12/237,070, filed Sep. 24, 2008.

U.S. Appl. No. 12/356,143, filed Jan. 20, 2009.

International Search Report & Written Opinion, PCT/US2010/020093, mailed Jul. 22, 2010.

International Search Report & Written Opinion, PCT/US2010/020086, mailed Aug. 9, 2010.

Office Action mailed Apr. 29, 2011 for U.S. Appl. No. 12/356,143.

McClain et al., "Design of Nonionic Surfactants for Supercritical Carbon Dioxide," Science, vol. 274, Dec. 1996, pp. 2049-2052.

Harris, "Quantitative Chemical Analysis," © 2010 W.H. Freeman & Company, pp. AP14-AP19.

Office Action in Taiwan Application No. 98145184 dated Jun. 4, 2015.

Final Office Action mailed Feb. 8, 2013 for U.S. Appl. No. 12/356,143.

Final Office Action mailed Nov. 9, 2011 for U.S. Appl. No. 12/356,143.

Notice of Allowance mailed Dec. 12, 2011 for U.S. Appl. No. 12/237,070.

Office Action mailed Sep. 27, 2011 for U.S. Appl. No. 12/237,070.

* cited by examiner

METHODS FOR PREVENTING PRECIPITATION OF ETCH BYPRODUCTS DURING AN ETCH PROCESS AND/OR SUBSEQUENT RINSE PROCESS

BACKGROUND OF THE INVENTION

1. Field of the Invention

This invention generally relates to methods and solutions for processing a microelectronic topography and, more specifically, to methods for preventing precipitation of etch byproducts onto a microelectronic topography during an etch process and/or a subsequent rinse process.

2. Description of the Related Art

The following descriptions and examples are not admitted to be prior art by virtue of their inclusion within this section.

The fabrication of microelectronic topographies generally includes a plurality of processing steps including but not limited to depositing, patterning, and etching materials to form a compilation of device structures. In some embodiments, conductive structures may be formed within a sacrificial layer of a microelectronic topography and then portions or all of the sacrificial layer may be subsequently removed, exposing the sidewalls of the conductive structures. Thereafter, the microelectronic topography may be rinsed with deionized water to remove the etching solution and/or byproducts and subsequently dried. In some cases, the etching, rinsing, and/or drying processes may cause the conductive structures to collapse (i.e., topple towards each other) rendering the microelectronic topography unusable. The occurrence of feature collapse appears to be increasing, particularly as width dimensions of structures continue to decrease and resulting aspect ratios increase with the ever pressing goal to increase processing speed and memory density of integrated circuits. In particular, it appears that the aspect ratios of conductive structures may, in some embodiments, be increased to an extent that surface tension of liquids between the conductive structures causes the conductive structures to collapse.

One technique which has been shown to mitigate feature collapse is to etch a sacrificial layer in an environment of a supercritical fluid and subsequently vent the etch chamber such that the formation of a liquid on the topography is prevented. In general, supercritical fluids are void of surface tension. As such, generally no fluids bearing surface tension are placed between device structures of a topography during such a process. Consequently, feature collapse may be abated. A disadvantage of etching in an environment of a supercritical fluid, however, is that etch byproducts generated during the etch process tend to have low solubility in the supercritical fluid and may be susceptible to precipitating onto the topography. In some cases, precipitates of etch byproducts may undesirably alter and, in some embodiments, detrimentally affect the functionality of an ensuing device. For example, precipitates of dissolved oxide may, in some cases, increase contact resistance on conductive device structures. As such, a process for removing precipitant material may be desired after an etch process which is prone to produce precipitant material. However, in order to remove material precipitated upon a topography, a wet rinse is typically needed. As noted above, employing wet processes on a microelectronic topography having device structures may lead to feature collapse due to the surface tension of the fluids.

It would, therefore, be advantageous to develop methods for preventing precipitation of etch byproducts onto a topography during and subsequent to etching portions of the topography in an environment of a supercritical fluid.

SUMMARY OF THE INVENTION

The problems outlined above may be in large part addressed by modifying etch and/or subsequent rinse processes and solutions to prevent the precipitation of etch byproducts on a microelectronic topography. The following are mere exemplary embodiments of methods for employing such modifications and are not to be construed in any way to limit the subject matter of the claims.

Embodiments of the methods include loading a microelectronic topography into a process chamber and selectively etching a sacrificial layer comprising an upper surface of the microelectronic topography using an etch solution which includes a fluid in a supercritical state or a liquid state. Furthermore, the methods include introducing a rinse solution into the process chamber subsequent to the etch process, where the rinse solution includes a fluid in a supercritical state or in a liquid state. In some cases, a chemistry which is chemically configured to modify dissolved etch byproducts within an ambient environment of the microelectronic topography may be introduced into the process chamber at least partially during one or both of the etch and rinse processes such that the dissolved etch byproducts are inhibited from precipitating onto the topography.

BRIEF DESCRIPTION OF THE DRAWINGS

Other objects and advantages of the invention will become apparent upon reading the following detailed description and upon reference to the accompanying drawings in which.

Figure 1:
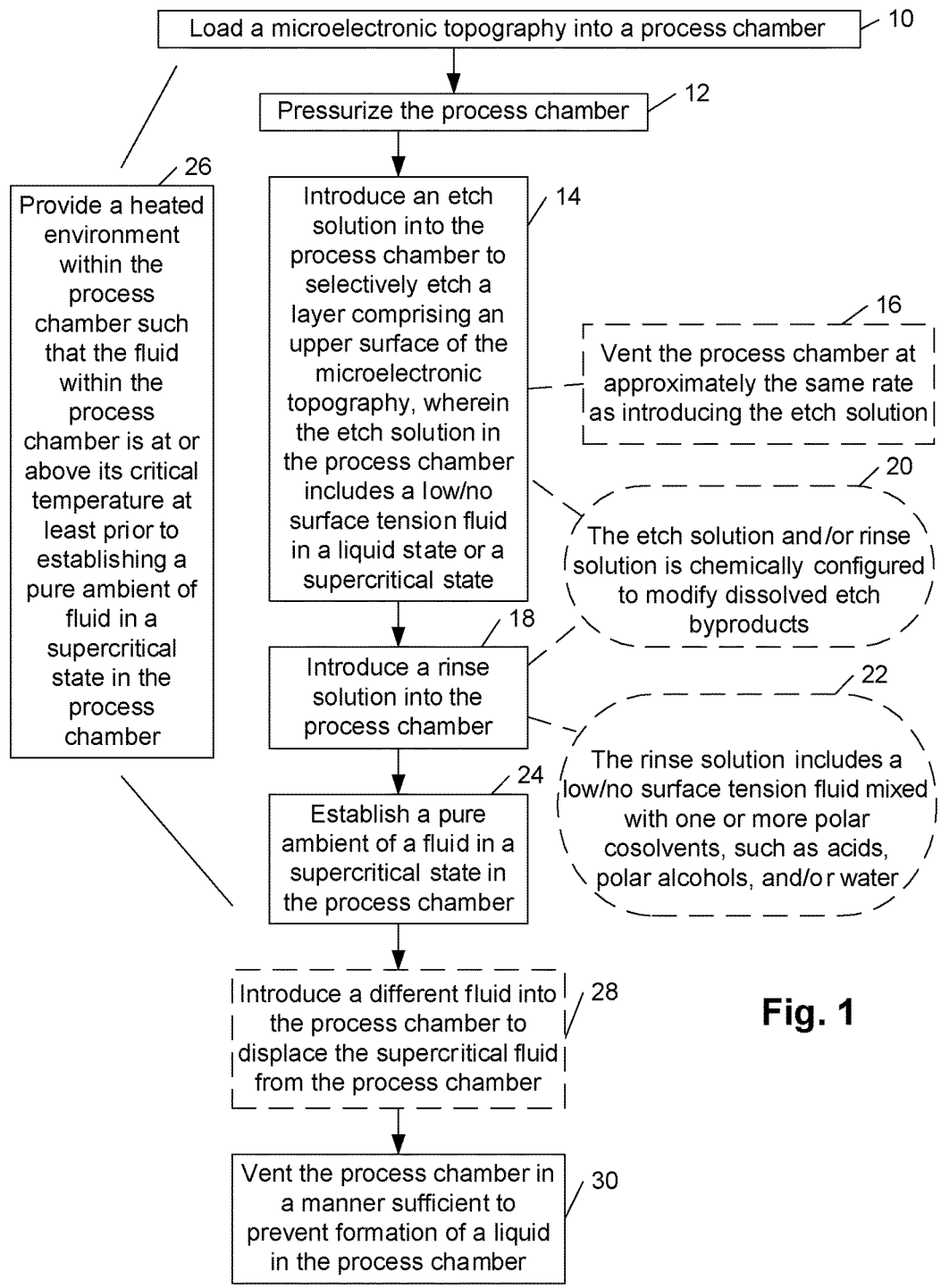
FIG. 1 depicts a flowchart of an exemplary method for processing a substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, exemplary embodiments of methods for preventing condensation and precipitation of etch byproducts onto a microelectronic topography during an etch process and/or a subsequent rinse process are illustrated and described in reference to FIG. 1. It is noted that the methods described herein are not necessarily limited to the flowchart depicted in FIG. 1. In particular, the methods described herein may include additional steps not shown in FIG. 1 for the fabrication of a microelectronic device and/or a circuit, including steps performed prior to, intermediate to, and/or after the steps shown in FIG. 1. In addition, as set forth in more detail below, some of the processes depicted in FIG. 1 may be optional and, thus, may be omitted from the methods described herein in some cases. In general, the term "microelectronic topography", as used herein, may refer to a topography having one or more layers and/or structures used to form a microelectronic device and/or circuit. As such, the term may refer to topographies used at any stage during fabrication of a microelectronic device and/or circuit. A microelectronic topography may alternatively be referred to as a "semiconductor topography" and, as such, the terms are used interchangeably herein.

As shown in block 10 of FIG. 1, the methods described herein include loading a microelectronic topography into a process chamber. As described in more detail below, the process chamber may be particularly configured for transposing a fluid introduced into the chamber into a supercritical state such that the microelectronic topography may be processed in a manner which mitigates feature collapse. In general, any process chamber configured to generate and withstand such pressures may be used. More specifically, any process chamber configured to generate and withstand pressures sufficient to transpose and/or sustain the fluid/s selected for the processes described below in reference to blocks 14, 18, and/or 24 of FIG. 1 in a supercritical state may be used. A pressure range greater than approximately 1000 psig may be suitable for transposing and/or sustaining many fluids in consideration for the methods described herein and, thus, a process chamber generally configured to generate and withstand pressures greater than approximately 1000 psig may be employed. Process chambers configured to generate and withstand lower pressures, however, may be used.

After the microelectronic topography is loaded into the process chamber, the process chamber may be pressurized as noted in block 12 in FIG. 1. In general, the pressurizing process may include introducing a fluid in a gas state into the process chamber. In some cases, the fluid used to pressurize the chamber may be a fluid that is subsequently used to selectively etch a layer of the microelectronic topography, a process which is described in more detail below in reference to block 14. In such embodiments, the pressurizing process outlined in block 12 may include introducing the fluid in a gas state into the process chamber until a chamber pressure equal to or greater than a saturated vapor pressure of the fluid or the critical pressure of the fluid is attained. At such a point, the fluid is transposed into a liquid state or a supercritical state (depending on the temperature of the process chamber interior). As described in more detail below in reference to block 14, the selective etch process of the topography is performed using a fluid which is in liquid state or a supercritical state. As such, pressurizing the process chamber with a fluid used to subsequently etch the topography may offer a manner in which to easily transition the process chamber from the pressurizing process to the etch process. In other embodiments, however, the process chamber may be pressurized with a fluid different from the fluid/s used to selectively etch the topography. For instance, the process chamber may be pressurized with nitrogen. In such cases, the nitrogen may be flushed from the process chamber upon introducing the etching solution for the subsequent selective etch process.

Continuing to block 14, a layer of the microelectronic topography is selectively etched by use of an etch solution comprising at least one fluid in a liquid state or a supercritical state. The at least one fluid is a fluid which has (or has the ability to attain) substantially low surface tension (e.g., less than approximately 30 dynes/cm) or no surface tension and, thus, is referred to hereinafter as a "low/no surface tension fluid." As noted below, the etch solution includes additional chemistries, which may be in a liquid, gas, or plasma state and, thus, the etch solution includes other fluids. The duration of the selective etch process may generally depend on the etchant used, but an exemplary period may be between approximately 20 seconds and approximately 1 minute.

As described above, etching a microelectronic topography in an environment of a supercritical fluid is beneficial for inhibiting subsequent feature collapse. In particular, a supercritical etching environment may generally offer an easy transition to a supercritical drying environment that effectively inhibits feature collapse. The methods described herein, however, are not necessarily limited to etching in a supercritical environment. In particular, the selective etching process outlined in block 14 may alternatively include etching a layer of a microelectronic topography using a low/no surface tension fluid in a liquid state. In such cases, remnants of liquids may remain upon the microelectronic topography surrounding the devices structures during and/or subsequent to the etch process. As described above, due to the surface tension of liquids, the remnants have the potential to cause the device structures to collapse. The methods described herein, however, avoid such detrimental effects by exposing the microelectronic topography to a sequence of process steps for inhibiting feature collapse, which is outlined in blocks 24-30 of FIG. 1 and described in more detail below.

In order to ease the complexities of the process chamber and/or timing for performing the methods described herein, it may be advantageous for the low/no surface tension fluid of the etch solution to have a thermodynamic critical point which is relatively easy to attain (i.e., having a relatively low critical temperature and critical pressure), particularly when the fluid is used during subsequent processing for rinsing the topography and/or venting the process chamber. As set forth in more detail below, a supercritical ambient is established within the process chamber at some point during the methods described herein prior to the venting process described in reference to block 30 of FIG. 1. As such, in embodiments in which the low/no surface tension fluid used for the etch process is the same as the rinsing and venting processes, a fluid having a thermodynamic critical point which is relatively easy to attain may be desirable. Exemplary fluids include but are not limited to carbon dioxide and sulfur hexafluoride.

Due to carbon dioxide's relatively low critical temperature of 31° C., it may be particularly beneficial to use carbon dioxide as a low/no surface tension fluid to etch the microelectronic topography in reference to block 14 and, in some cases, also to pressurize the process chamber in reference to block 12 and/or rinse the topography in reference to block 18. In particular, it may be desirable to minimize the temperature required for processing such that heating mechanisms (i.e., heat exchangers or heaters internal to the process chamber) may be minimized. Furthermore, carbon dioxide is relatively inexpensive compared to other fluids having a thermodynamic critical point which is relatively easy to attain and, thus, for that reason alone it may be desirable to employ carbon dioxide as a low/no surface tension fluid to etch the microelectronic topography and, in some cases, also pressurize the process chamber and/or rinse the topography.

Figure 2:
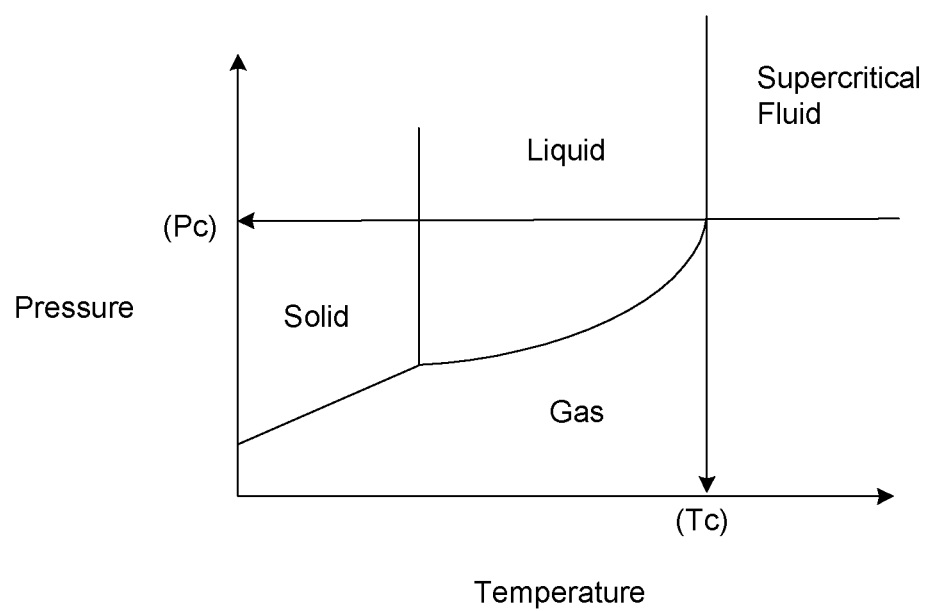
FIG. 2 depicts a pressure-temperature phase diagram of carbon dioxide.

As noted above, the low/no surface tension fluid used to etch the microelectronic topography may be in a liquid state or a supercritical state, which is generally dependent on the pressure and temperature of the process chamber interior. A pressure-temperature phase diagram for carbon dioxide is depicted in FIG. 2 to illustrate such a phenomenon. An exemplary range of pressure to which the process chamber may be pressurized when carbon dioxide, for example, is used in an etch solution to etch the microelectronic topography may be between approximately 800 psig and approximately 4000 psig. In some embodiments, the pressure range of the process chamber may be between approximately 800 psig and approximately 2900 psig when carbon dioxide is used in an etch solution used to etch the microelectronic topography. In cases in which the temperature of carbon dioxide within the process chamber is above its critical temperature and, thus, a supercritical state is attained, an exemplary range of pressure to which the process chamber may be pressurized may be between approximately 1100 psig and approximately 4000 psig and, more specifically, between approximately 1500 psig and approximately 2900 psig.

In general, heating mechanisms for a process chamber which is configured to generate and withstand pressures greater than approximately 1000 psig may be complex, particularly for requirements of high temperatures. Furthermore, the amount of energy needed to heat a process chamber may generally increase exponentially with temperature requirements. As such, it may be advantageous, in some embodiments, to minimize the temperature at which to heat the process chamber to attain a particular state of the low/no surface tension fluid. For example, when carbon dioxide is used in an etch solution to etch the topography, it may be advantageous to limit heating the process chamber to a temperature less than approximately 60° C. and, in some embodiments, less than approximately 40° C. Higher temperatures, however, may be employed. In cases in which carbon dioxide is be used in a liquid state in an etch solution to etch a layer of a microelectronic topography, it may be advantageous to limit heating the process chamber to a temperature less than approximately 30° C. and, in some embodiments, less than approximately 20° C.

In addition to the low/no surface tension fluid noted above, the selective etch process includes additional chemistries applicable for removing a layer of the topography. Exemplary chemistries may include, for example, a chlorine or fluorine-based plasma etchant, such as $CF_4$ and/or $CHF_3$. Alternatively, a liquid etch solution containing hydrogen fluoride (HF) that is soluble in the low/no surface tension fluid may be used. For instance, a solution containing approximately 0.1% to approximately 10% HF and approximately 0.1% to approximately 10% water, with a balance of one or more polar cosolvents (all by weight) may be added to the low/no surface tension fluid. Other compositions of liquid etch solutions containing HF may also be considered. For example, in some embodiments, the liquid etch solution may include a buffering agent, such as ammonium fluoride at a weight concentration between approximately 0.1% and approximately 10%. In addition or alternatively, a pyridine adduct may be included in the etch solution. In any case, the additional chemistries may be added to the process chamber after the low/no surface tension fluid has been added and the specified liquid state or supercritical state has been established (such as via the pressurizing process). In other embodiments, however, the additional chemistries may be combined with the low/no surface tension fluid prior to being introduced into the chamber. In such cases, the low/no surface tension fluid may be in a liquid state or a gas state upon being introduced into the chamber and, if applicable, transposed into the specified liquid or supercritical state in the process chamber.

In general, the microelectronic topographies which may be considered for the methods described herein may include a semiconductor substrate such as a monocrystalline silicon, gallium-arsenic, indium phosphide, silicon-germanium, silicon-on-insulator, or silicon-on-sapphire substrate. The semiconductor substrate may be doped either n-type or p-type and, in some embodiments, diffusion regions and/or isolation regions may be formed therein. In some cases, the microelectronic topography may include structures and layers formed upon and above the semiconductor substrate and below the device structures and sacrificial layer described below. The structures and layers formed upon and above the semiconductor substrate may include, but are not limited to, dielectric layers, metallization layers, gate structures, contact structures, vias, or local interconnect wires.

As set forth below, the methods described herein may be particularly applicable to microelectronic topographies having device structures encased within a sacrificial layer. In particular, the methods described herein may be particularly suitable for providing a manner in which to selectively remove a sacrificial layer comprising an upper surface of a microelectronic topography such that sidewall surfaces of device structures encased within the sacrificial layer are exposed and further preventing feature collapse of the device structures during such processing. It is noted, however, that the methods described herein is not so limited. In particular, the methods described herein may be applicable to any microelectronic topography having a material which is to be selectively etched with respect to another material of the topography. In particular, the methods described herein are not necessarily limited to topographies including the materials and structures discussed below.

As noted above, a microelectronic topography considered for the methods described herein may, in some embodiments, include a plurality of device structures encased within a sacrificial layer formed above a semiconductor substrate. The material of the device structures may include any material used in the semiconductor industry for conductive device structures, including but not limited to polysilicon, aluminum, copper, titanium, titanium nitride, tungsten, and/or any alloys thereof. Although the methods described herein may be applied to topographies having device structures of any dimension, the methods may be particularly applicable to topographies having devices structures with aspect ratios equal to or greater than approximately 10:1, since device structures with such aspect ratios are generally more susceptible to feature collapse. The term "aspect ratio," as used herein, may generally refer to a ratio of height to width of a feature. Exemplary widths for the device structures may be between approximately 10 nm and approximately 250 nm and exemplary spacings between the device structures may be between approximately 10 nm and approximately 100 nm. Widths and/or spacings of other dimensions, however, may be considered, particularly as technology develops to decrease device dimensions. Although not necessarily so limited, the device structures may, in some embodiments, be formed by a damascene process. In particular, the material of the device structures may be deposited within trenches of a sacrificial layer and the topography may be subsequently polished to remove portions of the device structure material on the upper surface of the sacrificial layer.

In general, the sacrificial layer may include any material which may be selectively removed relative to the material of the device structures. Exemplary materials for the sacrificial layer include but are not limited to silicon dioxide ($SiO_2$), tetraorthosilicate glass (TEOS), silicon oxynitride ($SiO_xN_y$ ($N_z$)), silicon dioxide/silicon nitride/silicon dioxide (ONO) or, in general, any oxide layer. The term "oxide layer," as used herein, may generally refer to a layer including oxygen atoms incorporated therein. As set forth in more detail below, some of the methods described herein may be particularly applicable to processes in which the sacrificial layer includes an oxide layer. More specifically, embodiments in which the etch solution and/or the rinse solution are chemically configured to modify dissolved oxide etch byproducts in an ambient of the microelectronic topography may be particularly applicable for cases in which the sacrificial layer includes an oxide layer since etching such a layer will generate oxide etch byproducts. Details of the chemical configurations of the etch solution and/or rinse solution in such cases are described in more detail below in reference to block 20. Regardless of its composition, the sacrificial layer may be doped or updoped. As such, in some embodiments, the sacrificial layer may include borophosphorus silicate glass (BPSG), phosphorus silicate glass (PSG), or fluorine silicate glass (FSG).

In general, the selective etch process may remove portions of the sacrificial layer adjacent to the device structures such that sidewall surfaces of the device structures are exposed. In some cases, the selective etch process may be conducted such that the device structures are free standing. In any case, the selective etch process may remove the entirety of the sacrificial layer across the microelectronic topography or may only remove a portion of the sacrificial layer in the vicinity of the device structures. In the latter embodiment, portions of the sacrificial layer slated to remain within the microelectronic topography (i.e., the portions of the sacrificial layer not in the vicinity of the device structures) may be masked for the selective etch process.

As noted in block 16, the methods described herein may, in some embodiments, include venting the process chamber at approximately the same rate as the etch solution is introduced into the chamber. Such simultaneous processes may be dually referred to as a "flow-through process" and includes introducing a fresh composition of the etch solution into the process chamber while simultaneously venting the chamber. The phrase "fresh composition" may generally refer to an etch solution which has not been previously processed through the process chamber and, thus, excludes recycled etch solutions. A flow-through process introducing a fresh composition of an etch solution advantageously allows byproducts resulting from the etch process to be efficiently removed from the process chamber. Since the byproducts will not linger within the process chamber, they will be less likely to precipitate onto the microelectronic topography. It is noted by the dotted line connecting blocks 14 and 16 as well as the dotted line bordering block 16, the venting process is optional and, thus, in some cases, may be omitted from the methods described herein. In particular, the etch process described in reference to block 14 may alternatively include introducing a batched amount of etch solution into the process chamber and processing the microelectronic topography using the batched amount. In yet other embodiments, the etch solution may be recycled during the etch process.

As shown in block 18 of FIG. 1, the method includes introducing a rinse solution into the process chamber subsequent to the selective etch process. The rinse process may generally be used to remove, modify, and/or dilute residual etch solution and/or etch byproducts from the topography and, in some embodiments, may further serve as a transitional rinse to lower the surface tension of any liquid which may be on the topography. As set forth below, the rinse solution includes at least one low/no surface tension fluid [i.e., a fluid which has (or has the ability to attain) substantially low surface tension (e.g., less than approximately 30 dynes/cm) or no surface tension] either in a liquid state or a supercritical state, similar to the etch solution described in reference to block 14. As also noted below, the rinse solution may include additional chemistries, which may be in a liquid, gas, or plasma state and, thus, the rinse solution may include other fluids. In any case, the duration of the rinse process may vary, but may generally be less than approximately 60 seconds.

In some embodiments, the low/no surface tension fluid of the rinse solution may be different from the low/no surface tension fluid used in the etch solution. In other cases, however, the low/no surface tension fluid of the rinse solution may include the same low/no surface tension fluid used in the etch solution. In such embodiments, the commonality between the etch solution and rinse solution may facilitate a smooth transition from the etch process to the rinse process, particularly in embodiments in which the etch process includes a flow-through process as discussed above in reference to block 16 of FIG. 1. More specifically, the etch process may terminate by ceasing the introduction of any additional etch chemistries to the process chamber (i.e., chemistries introduced in addition to the low/no surface tension fluid) and, thus, the rinse process may start with the continued introduction of the low/no surface tension fluid into the process chamber. Alternatively, the start of the rinse process may be delayed from the termination of the etch process.

In any case, in order to ease the complexities of the process chamber and/or timing for performing the methods described herein, it may be advantageous in some embodiments for the low/no surface tension fluid of the rinse solution to have a thermodynamic critical point which is relatively easy to attain (i.e., having a relatively low critical temperature and critical pressure). In particular, as set forth in more detail below, a supercritical ambient is established within the process chamber at some point during the methods described herein prior to the venting process described in reference to block 30 of FIG. 1. As such, in embodiments in which the low/no surface tension fluid used for the rinse process is the same as the venting process, a fluid having a thermodynamic critical point which is relatively easy to attain may be desirable. Exemplary fluids may include but are not limited to carbon dioxide and sulfur hexafluoride and, in some cases, carbon dioxide may be specifically used for reasons similar to the ones described for the etch process outlined in block 14. In some embodiments, it may be advantageous for the low/no surface tension fluid of the rinse solution to be at a temperature and a pressure greater than approximately 90% of its thermodynamic critical points. In particular, such thermodynamic processing range may aid in reducing the amount of time needed to subsequently establish a pure ambient of the low/no surface tension fluid in a supercritical state in the process chamber when the fluid is used for the process outlined in block 24, which is described in more detail below.

In some embodiments, the rinse process may employ a single rinse formulation (i.e., a single formulation without having its composition altered during the rinse process). In alternative cases, the rinse process may employ multiple and different rinse formulations successively introduced into the process chamber and, thus, successively exposed to the microelectronic topography. For example, the rinse process may include sequentially introducing rinse formulations having varying concentrations of a low/no surface tension fluid into the process chamber. In yet other cases, the rinse process may include gradually changing the composition of a rinse solution introduced into the process chamber (e.g., by gradually changing the concentration of a low/no surface tension fluid in the solution). In this manner, the surface tension of fluids in the environment of the microelectronic topography may be changed in a linear fashion as opposed to a graduated manner. In particular, a gradual change in concentration of the low/no surface tension fluid introduced into the process chamber as the rinse process progresses may advantageously allow the rinse solution within the process chamber to be substantially homogeneous and, thus, distinct interfaces of different rinse formulations may be avoided, which as described in more detail below may aid in preventing feature collapse particularly when the low/no surface tension of the rinse solution is in a liquid state.

In either case, the rinse formulation/s may, in some embodiments, be configured to increase the concentration of the low/no surface tension fluid introduced into the process as the rinse process progresses. In particular, a step-wise or gradual increase in concentration of the low/no surface tension fluid introduced into the process chamber as the rinse process progresses may facilitate an easy transition between the rinse process outlined in block 18 of FIG. 1 and the process of establishing a pure ambient of a low/no surface tension fluid in a supercritical state outlined in block 24 of FIG. 1 when the fluid is used for such a later process. It is noted that the number of rinse formulations introduced into the process chamber may generally depend on the design specifications of the fabrication process and, thus, may vary among applications.

As noted above, the rinse solution may include additional chemistries (i.e., components other than the low/no surface tension fluid). In some cases, such additional chemistries may aid in preventing dissolved etch byproducts from precipitating onto the microelectronic topography. For instance, the rinse solution may optionally include one or more polar cosolvents mixed with the low/no surface tension fluid as noted in block 22. In particular, etch byproducts generated from the etch process may, in some embodiments, be polar protic species. Moreover, some dissolved etch byproducts may have a tendency to self-condense and crosslink over time, further reducing their solubility in a non-polar environment. For instance, dissolved oxide precursors generated from etching an oxide layer are generally polar protic species which exhibit such tendencies. The solubility of such species may be increased, and therefore, a tendency to self condense decreased through the addition of one or more polar cosolvents to the non-polar low/no surface tension fluid used in the rinse process. In particular, the inclusion of one or more polar cosolvents with the low/no surface tension fluid increases the polarity of the fluid such that it is a better solvent for dissolved etch byproducts. The concentration of the one or more polar cosolvents within the rinse solution may vary among applications, but an exemplary concentration range may be between approximately 5% and approximately 40%, by weight. Larger or smaller concentrations, however, may be considered. The one or more polar cosolvents may include acids, polar alcohols, and/or water as noted in block 22.

In cases in which the polar cosolvents include an acid, an acid having a pKa lower than a pKa of the etch solution used in the etch process described in reference to block 14 may be advantageous. In particular, an acid having such a pKa value may offer sufficient polarity to the low/no surface tension fluid to inhibit initial condensation of dissolved etch precursors. Exemplary pKa ranges from which to select an acid may depend on the application, but acids having pKa's less than approximately 6.4 and, in some cases, less than approximately 3.5 may be of particular consideration relative to the etch solutions described above in reference to block 14. Exemplary acids which may be considered include trifluoroacetic acid, acetic acids, trifluoromethanesulfonic acid, methanesulfonic acid, benzoic acids, nitric acid, sulfuric acid, and hydrochloric acid. In addition or alternatively, water may be mixed with the low/no surface tension fluid for the rinse solution. In addition to serving as a polar cosolvent, water may also help prevent condensation of etch byproducts by making this dehydration process less thermodynamically favorable. In other embodiments, the one or more polar cosolvents of the rinse solution may additionally or alternatively include a polar alcohol, such as but not limited to methanol, ethanol, and isopropanol.

As noted in block 20 in FIG. 1, an additional or alternative manner in which to inhibit the precipitation of etch byproducts onto the microelectronic topography may include chemically configuring the etch solution and/or the rinse solution to modify dissolved etch byproducts. In particular, chemistry that is configured to modify known byproducts of the etch process may be added at least partially during and, in some cases, during an entire duration of one or both of the etch process and the rinse process, such that the solubility of the etch byproducts is increased within an ambient of the microelectronic topography during the etch and/or rinse processes, respectively. Interaction of the etch byproducts with this modification chemistry will decrease their tendency to condense and precipitate onto the microelectronic topography. The concentration of the modification chemistry within the etch and/or rinse solutions may vary among applications, but an exemplary concentration range may include up to approximately 10%, by weight. Larger concentrations, however, may be considered. The interaction between the chemistry and the etch byproducts may be covalent or non-covalent.

For example, in cases in which an oxide layer of a microelectronic topography is etched using the methods described herein, dissolved oxide etch byproducts, such as dissolved hydroxy silane complexes ($Si(OH)_4$) may reside within an ambient of the microelectronic topography during the etch process and, in some cases, the rinse process. As noted below, dissolved hydroxy silane complexes ($Si(OH)_4$) may result from a fluorine-based etch process used to etch an oxide layer. However, modification chemistries may be added to the ambient of the microelectronic topography during the etch process and/or rinse process to modify the dissolved hydroxy silane complexes, specifically to inhibit their condensation and precipitation. Exemplary modification chemistries may include, but are not limited to, silazanes, chlorosilanes, hydroxysilanes, alkoxysilanes, thionyl chlorides, acid anhydrides, carboxylic acids, isocyanates, amines, ammonium salts, alcohols, ethers and surfactants. In some cases, acids, bases or various catalysts may be added to facilitate the reaction with hydroxy silane. In addition to the modification chemistry having a reactive portion as described above, the chemistry may also contain a non-reactive portion that contains groups to facilitate solubility in the low/no surface tension fluid used for the etch process and/or rinse process. Exemplary non-reactive portions include hydrocarbons, fluorocarbons, and silicones. In some cases, the non-reactive portion may be sterically bulky to further help prevent hydroxy silane condensation.

In some cases, it may be particularly advantageous to optimize the thermodynamics and kinetics of the interaction between the modification chemistry and etch byproducts. In particular, optimizing the thermodynamics and kinetics of the reaction may generally maximize the effectiveness of the modification chemistry to inhibit byproduct precipitation. To improve the thermodynamics of the interaction, functional groups that are highly reactive with the etch byproducts may be used. For instance, silazanes and chlorosilanes may be thermodynamically favorable for reacting with hydroxy silane complexes. To favor the kinetics of the interaction, a significant excess of modification chemistry may be beneficial. For instance, in cases in which a 1 μm thick oxide coating on a 300 mm wafer is etched in a 1 liter pressure vessel, the molar concentration of dissolved oxide should be approximately 0.01 M. In such an example, the molar concentration of the modification chemistry within the etch solution and/or rinse solution may be greater than approximately 0.1 M in order to provide sufficient kinetic interaction between the chemistry and etch byproducts such that the etch byproducts do not precipitate. In addition, employing a flow-through process for the etch process and/or rinse process (such as described above for the etch process in reference to block 16) may also be kinetically favorable by sweeping away etch byproducts from the substrate surface as it is formed and decreasing its localized and absolute concentration in the ambient of the microelectronic topography.

In addition to using modification chemistry that is highly reactive with the etch byproducts, it is further beneficial that the modification chemistry not be reactive with itself. If, however, self-reactive chemistry is used, it is preferred that monfunctional modification chemistry is used so that only dimers are formed. For example, modification chemistry that contains alkoxy silane functionality would likely be suitably reactive with hydroxy silane groups, but will also self-condense. Dialkoxy and trialkoxy silanes that contain more than one self-condensable functionality per molecule will likely lead to oligomer formation and/or cross-linked silanes that have little chance of maintaining solubility in the low/no surface tension fluid. Therefore, when using alkoxysilane or similar self-reactive modification chemistry in the etch solution or the rinse solution, monoalkoxysilanes will be preferred because the silane dimers that are formed from their self-condensation reaction should still maintain solubility in the low/no surface tension fluid. Similar reasoning may apply to chlorosilanes, which generally are self-reactive and, thus, monochlorosilanes may be preferred.

An explanation of why oxide etch products of a fluorine-based etch process in conventional processing are prone to condense and precipitate onto a microelectronic topography is outlined below. Although the solution variations discussed above in reference to blocks 20 and 22 may be applicable to preventing condensation and precipitation of oxide etch byproducts, it is noted that the methods described herein are not so limited. In particular, the general concepts of the ideas discussed in reference to blocks 20 and 22 (as well as block 16 above) for inhibiting etch byproduct precipitation may be applied to prevent precipitation of etch products of any composition, depending on the etch solution used and the material composition of the layer being etched. Furthermore, the processes discussed in reference to blocks 16, 20, and 22 are not necessarily mutually exclusive. In particular, the methods described herein may employ any combination of such processes or any one of such processes, depending on the design specifications of the fabrication process.

In an oxide layer etch process, $SiF_4$ is generated as one of the etch by-products regardless of the fluoride-based etch chemistry used. $SiF_4$ reacts quickly with water to form a hydroxy silane complex $(Si(OH)_4)$ as outlined in Formula 1:

$$SiF_4 + 4\ H_2O \rightarrow Si(OH)_4 + 4\ HF \quad (1)$$

Due to its limited solubility in a non-polar environment, a hydroxy silane complex will begin to condense with other hydroxy silanes to form a silane oligomer (i.e., $(HO)_3Si-O-Si(OH)_3$) as denoted in Formula 2:

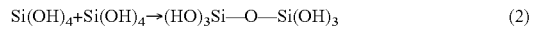

$$Si(OH)_4 + Si(OH)_4 \rightarrow (HO)_3Si-O-Si(OH)_3 \quad (2)$$

The silane oligomers have the potential to continue to condense to reform oxide (i.e., $(Si-O)_n$) and precipitate out of solution as denoted in Formula 3:

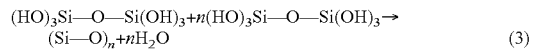

$$(HO)_3Si-O-Si(OH)_3 + n(HO)_3Si-O-Si(OH)_3 \rightarrow (Si-O)_n + nH_2O \quad (3)$$

The process and/or solution modifications discussed in reference to blocks 16, 20 and 22, however, have shown to inhibit condensation and precipitation of oxide etch byproducts on microelectronic topographies during and subsequent to an oxide etching process.

As noted above, the etch process and/or the rinse process may, in some cases, be conducted using fluids in a liquid state. In such cases, remnants of one or more liquids may remain upon the microelectronic topography surrounding devices structures during and/or subsequent to the etch and/or rinse processes. As noted above, due to the surface tension of liquids, the remnants may, in some embodiments, cause the device structures to collapse. The methods described herein, however, avoid such detrimental effects by exposing the microelectronic topography to a sequence of process steps which inhibit feature collapse, which is outlined in blocks 24-30 of FIG. 1 and described in more detail below.

In addition to the sequence of steps outlined in block 24-30, one manner in which to prevent feature collapse is to keep the device structures submerged within liquids prior to establishing a supercritical ambient within the process chamber. In particular, such a precaution may prevent the microelectronic topography from prematurely drying and/or prevent device structures of the microelectronic topography from being exposed to interfacial tension of different media. It is postulated that, as feature spacings continue to decrease and aspect ratios of device structures continue to increase (e.g., aspect ratios on the order of approximately 20:1 or greater), interfacial tension may cause device structures to collapse prior to a topography drying. More specifically, it is hypothesized that, in some embodiments, the mere exposure of the device structures to a liquid-gas interface or a liquid-liquid interface may increase the likelihood of feature collapse. As such, allowing a microelectronic topography to prematurely dry out may not be the only factor contributing to feature collapse.

The amount of liquid needed to submerge device structures of a microelectronic topography may generally vary among applications. In some embodiments, however, it may be particularly advantageous for the upper surfaces of the device structures to be below a liquid-gas interface by at least approximately 3 mm and, in some cases, between approximately 3 mm and approximately 25 mm and, more specifically, between approximately 5 mm and approximately 12 mm. Without being bound to theory, it is hypothesized that such a submersion range may be sufficient to prevent the microelectronic topography from drying and/or devices structures thereon from being exposed prior to establishing a supercritical ambient within the process chamber. In some cases, however, smaller submerging buffers may be considered. In some embodiments, the etch and/or rinse solutions may be additionally or alternatively configured to prevent the formation of a liquid-liquid interface around device structures of a microelectronic topography. In particular, the etch and/or rinse solutions may, in some embodiments, include a material which increases the dispersion forces of the two fluids, such as a surfactant. In yet other embodiments, the etch and rinse processes may be performed in the presence of a fluid in a supercritical state.

It is noted that submerging device structures in liquid is not necessarily required for the methods described herein. In particular, the methods may alternatively include adding the etch solution and/or rinse solution to the microelectronic topography such that liquid formulations are at a level below the upper surfaces of the device structures. More specifically, it is theorized that the likelihood that the microelectronic topography may be dried or device structures may be exposed prior to establishing an ambient of a supercritical fluid within the process chamber and, thus, the likelihood that device structures may be susceptible to feature collapse, may be dependent on the feature spacings and/or aspect ratios of the device structures. In particular, in the development of the methods and solutions described herein, feature collapse did not occur in all cases in which device structures were not submerged in liquid formulations, but appeared to be more prevalent with smaller feature spacings and/or larger aspect ratios of device structures. A particular range of feature spacings and aspect ratios requiring device structure submersion was not investigated, but it is noted that such an endeavor would not require undue experimentation of one skilled in the art based on the teachings provided herein. As such, submersion of device structures is not necessarily required, but rather is presented as an optional course of action for the etch process and/or rinse process described herein.

As noted above and in block 26 of FIG. 1, the method includes providing a heated environment within the process chamber at some point in the sequence of processes outlined in blocks 10-30 of FIG. 1 such that the low/no surface tension fluid within the process chamber at block 30 is at or above its critical temperature for the venting process described relative thereto. In this manner, the low/no surface tension fluid in the process chamber may assume a supercritical state for the venting process. For instance, the process chamber may be heated to a temperature greater than or equal to approximately 31° C. when carbon dioxide is in the process chamber or, alternatively, to a temperature greater than or 45.5° C. when sulfur hexafluoride is in the process chamber.

As noted above, heating mechanisms for a process chamber which is configured to generate and withstand the pressures described herein may be complex, particularly for requirements of high temperatures. Furthermore, the amount of energy needed to heat a process chamber may generally increase exponentially with temperature requirements. As such, it may be advantageous, in some embodiments, to minimize the temperature at which to heat the process chamber to attain a supercritical state of a low/no surface tension fluid. For example, when carbon dioxide is used within the process chamber, it may be advantageous to limit heating the process chamber to a temperature between approximately 31° C. and approximately 60° C. and, in some embodiments, between approximately 31° C. and approximately 40° C. Higher temperatures, however, may be employed. In some cases, it may be advantageous to heat the process chamber to a temperature range one or more degrees above the critical temperature of the low/no surface tension fluid to insure a supercritical state of the fluid may be maintained for the venting process described in reference to block 30. For example, when carbon dioxide is used within the process chamber, it may be advantageous to heat the process chamber within a temperature range between approximately 35° C. and approximately 40° C. Other temperature ranges may be considered.

In some embodiments, the process of providing the heated environment (i.e., block 26) may be conducted subsequent to pressurizing the process chamber in block 12. In other words, the process of pressurizing the process chamber may be conducted within a temperature range below the critical temperature of the low/no surface tension fluid used during such a process. In such embodiments, the low/no surface tension fluid will transform into a liquid state when a saturated vapor pressure within the process chamber is attained. An exemplary temperature range for pressurizing a process chamber in such a manner with carbon dioxide may generally include introducing the carbon dioxide into the process chamber at a temperature less than approximately 30° C. and, more specifically, between approximately 0° C. and approximately 20° C. Sometime subsequent to attaining saturated vapor pressure within the process chamber, the temperature of the process chamber may be increased to a temperature equal to or above the critical temperature of a low/no surface tension fluid. At the point of attaining critical temperature, the low/no surface tension fluid will transform into a supercritical state. The supercritical state and, thus temperatures and pressures equal to or above the thermodynamic critical point of the low/no surface tension fluid, is preferably maintained until at least the venting process described below in reference to block 30 is conducted.

In other embodiments, the process chamber may be preheated to a critical temperature of a given fluid (i.e., prior to pressurizing the process chamber with a low/no surface tension fluid and even prior to loading the microelectronic topography within the process chamber). An advantage of such embodiments is it may be more time efficient to do so versus providing the heated environment after pressurizing the process chamber and/or loading the microelectronic topography. In particular, due to the process chamber having to generate and withstand relatively high pressures, the process chamber may have substantially thick walls. Increasing the temperature within such a process chamber may take a substantial amount of time (e.g., on the order of 30 to 60 minutes), which may substantially delay the fabrication process and, thus, be undesirable for production yield. In alternative cases, the process of providing the heated environment (i.e., establishing a critical temperature within the process chamber) may be conducted while pressurizing the process chamber (i.e., block 12). In any case, the critical temperature may be maintained thereafter until at least the venting process described below in reference to block 30 is conducted. In this manner, a low/no surface tension fluid will transform and remain in a supercritical state when the critical pressure of the fluid within the process chamber is attained.

Regardless of when a low/no surface tension fluid within the process chamber is heated to its critical temperature, the method may, in some embodiments, continue to block 24 to establish a pure ambient of a low/no surface tension fluid in a supercritical state in the process chamber. In other words, the methods described herein may proceed to establish an ambient within the process chamber which is free of the supplementary solution components previously added to the process chamber in reference to the etch and rinse processes. In this manner, the process chamber may be flushed of any supplementary chemicals added during the etch and rinse processes. In addition, block 24 may establish an environment in the process chamber for a low/no surface tension fluid to be in a supercritical state if such conditions were not already established in the preceding rinse process described in reference to block 18.

In some embodiments, the low/no surface tension fluid used to establish the ambient referenced in block 24 may be the same low/no surface tension fluid used in the rinse solution. In such cases, the supply of the low/no surface tension fluid used for the rinse process may continue sans the supply of the rinse adjuncts. In yet other embodiments, the low/no surface tension fluid used to establish the ambient referenced in block 24 may be different than the low/no surface tension fluid used in the rinse solution. In particular, the process referenced in block 24 may include exposing the microelectronic topography to a fluid different than the rinse solution for a predetermined period of time to displace the rinse solution from the process chamber. In such cases, the fluid introduced for the process of block 24 may be at a pressure greater than the pressure of the rinse solution in the process chamber.

In some cases, the low/no surface tension fluid used to establish the ambient referenced in block 24 may, in some embodiments, be immiscible with the rinse solution within the chamber. In addition, the low/no surface tension fluid used to establish the ambient referenced in block 24 may, in some cases, have a lower density, critical temperature, and Joule-Thompson coefficient of expansion than the rinse solution within the process chamber. As set forth below in reference to block 28, a fluid having such characteristics may be suitable for a faster venting with respect to block 30 in that the pressure with the process chamber can be reduced at a much faster rate without damage to features on the microelectronic topography. Exemplary fluids which may be used to establish the ambient referenced in block 24 for such situations may include but are not limited to helium, argon, nitrogen, oxygen, and mixtures thereof. In such cases, once a pure ambient of the fluid in a supercritical state is established in the process chamber, the process of block 24 may realize the benefits described below in reference to block 28 during the venting process of block 30 and, thus, employing the process of block 28 separately from the process of block 24 may not be needed.

In general, the process referenced in block 24 may include introducing the low/no surface tension fluid into the process chamber in a gas state while simultaneously venting the process chamber. Depending on the temperature of the process chamber, the low/no surface tension fluid may assume a liquid state or a supercritical state. In cases in which the process chamber is not at its critical temperature, the process chamber may be given time to increase the temperature of the low/no surface tension fluid to assume a supercritical state for the subsequent vent process outlined in block 30. After a period of time sufficient to substantially remove any supplementary chemicals and a time to establish a supercritical state, the introduction of the low/no surface tension fluid may cease and the venting process may continue and be part of the venting process outlined in block 30.

The venting process outlined in block 30 is used to either transform the supercritical fluid into a gas state or flush the supercritical fluid from the process chamber in a flow-through process. In either case, the venting process for block 30 is conducted in a manner sufficient to prevent formation of a liquid in the process chamber. For example, in the first scenario, the venting process for block 30 may be performed by venting the process chamber at a rate that allows direct transition of the low/no surface tension fluid from the supercritical state to the gas state without formation of a liquid phase. In particular, the vent rate may be controlled to avoid expansion cooling leading to formation of liquid droplets in contact with the microelectronic topography. In some cases, however, the transition process may be time consuming, such as when carbon dioxide is the supercritical fluid. In particular, supercritical carbon dioxide has a high Joule-Thompson coefficient of expansion, which means that large amounts of heat are consumed as the fluid expands in the gas phase. This may be problematic if a fast venting process (e.g., less than approximately 1 minute) is desired since the cooling associated with expansion leads to liquid carbon dioxide formation that either boils to a gas or transitions back to supercritical phase depending on the pressure in the process chamber. In either case, the phase transition may lead to damage on delicate features of the microelectronic topography.

One method to achieve an accelerated venting process for block 30 is to use a different supercritical fluid to displace the supercritical fluid within the process chamber. Detailed descriptions of such a process are provided in U.S. Pat. No. 6,602,351 to DeYoung et al. and U.S. Pat. No. 6,905,555 to DeYoung et al., which are incorporated by reference as if fully set forth herein. The optional process is depicted in FIG. 1 in block 28 by introducing a different fluid into the process chamber while venting the process chamber such that the supercritical fluid established in reference to block 24 from the process chamber is displaced. The different supercritical fluid is generally immiscible with the fluid within the chamber. In addition, the different supercritical fluid preferably has a lower density, critical temperature, and Joule-Thompson coefficient of expansion than the fluid within the process chamber. As a consequence, pressure with the process chamber can be reduced at a much faster rate without damage to features on the microelectronic topography. In addition, such a technique does not cause a liquid to be formed within the process chamber and, thus, concerns of feature collapse are abated. Exemplary supercritical fluids which may be used for an accelerated venting process include but are not limited to helium, argon, nitrogen, oxygen, and mixtures thereof.

In any case, after pressure within the process chamber has been reduced to atmospheric pressure or the ambient pressure of the environment in which the process chamber resides, the microelectronic topography may be dry and undamaged. Further processing of the microelectronic topography may ensue in the process chamber or in a different process chamber.

It will be appreciated to those skilled in the art having the benefit of this disclosure that this invention is believed to provide method for preventing condensation and precipitation of etch byproducts onto a microelectronic topography during an etch process and/or a subsequent rinse process. Further modifications and alternative embodiments of various aspects of the invention will be apparent to those skilled in the art in view of this description. For example, although many of the examples described herein cite carbon dioxide as a low/no surface tension fluid for the etch and rinse processes, the methods described herein are not so limited. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for processing a microelectronic topography, comprising:
   loading a microelectronic topography into a process chamber;
   introducing an etch solution into the process chamber to selectively etch a layer comprising an upper surface of the microelectronic topography, wherein the etch solution within the process chamber comprises a fluid in a supercritical state or in a liquid state;
   subsequently introducing a rinse solution into the process chamber, wherein the rinse solution comprises the fluid in a supercritical state or in a liquid state; and
   introducing a chemistry into the process chamber at least partially during both of the steps of introducing the etch solution and introducing the rinse solution, wherein the chemistry is chemically configured to modify the dissolved etch byproducts within an ambient environment of the microelectronic topography such that the dissolved etch byproducts are inhibited from precipitating onto the microelectronic topography, and wherein the chemistry is a silazane, a chlorosilane, or an alkoxy silane.

2. The method of claim 1, wherein the step of introducing the chemistry into the process chamber comprise introducing the chemistry into the process chamber for an entire duration of at least one of the steps of introducing the etch solution and introducing the rinse solution.

3. The method of claim 1, wherein the layer comprising an upper surface of the microelectronic topography is an oxide layer.

4. The method of claim 3, wherein the step of selectively etching the layer produces etch byproducts comprising hydroxy silane groups.

5. The method of claim 1, further comprising introducing a catalyst into the process chamber at least partially during the step of introducing the chemistry into the process chamber to facilitate a reaction with the etch byproducts.

6. The method of claim 1, wherein the chemistry comprises a portion which is nonreactive with etch byproducts produced from selectively etching the layer comprising an upper surface of the microelectronic topography.

7. The method of claim 6, wherein the portion comprises hydrocarbons, fluorocarbons, or silicones.

8. The method of claim 1, wherein the chemistry comprises up to approximately 10% by weight of the etch solution or the rinse solution.

9. The method of claim 1, wherein the step of introducing the etch solution comprises introducing a fresh composition of the etch solution into the process chamber while simultaneously venting the process chamber.

10. The method of claim 1, wherein the chemistry comprises monoalkoysilanes or monochlorosilanes.

11. The method of claim 1, wherein the rinse solution further comprises one or more polar cosolvents mixed with the fluid.

12. The method of claim 11, wherein the one or more polar cosolvents comprises an acid having a pKa lower than a pKa of the etch solution.

13. The method of claim 11, wherein the one or more polar cosolvents comprise water and a polar alcohol.

14. The method of claim 1, further comprising introducing the fluid in a supercritical state into the process chamber subsequent to exposing the microelectronic topography to the rinse solution to displace the rinse solution from the process chamber.

15. The method of claim 1, further comprising introducing a different fluid into the process chamber at a pressure greater than the pressure of the rinse solution in the process chamber subsequent to the step of introducing the rinse solution into the process chamber, wherein the different fluid is immiscible with the rinse solution, and wherein the step of introducing the different fluid into the process chamber displaces the rinse solution within the process chamber.

16. The method of claim 1, wherein the step of subsequently introducing the rinse solution into the process chamber comprises introducing a rinse solution comprising the fluid at a temperature and a pressure greater than approximately 90% of thermodynamic critical points of the fluid into the process chamber.

17. The method of claim 1, wherein the step of selectively etching the layer comprises selectively etching a sacrificial layer encasing a plurality of device structures within the microelectronic topography.

18. The method of claim 1, wherein the fluid is carbon dioxide.

19. A method for processing a microelectronic topography, comprising:
   loading a microelectronic topography into a process chamber;
   introducing an etch solution into the process chamber to selectively etch a layer comprising an upper surface of the microelectronic topography, wherein the etch solution within the process chamber comprises a fluid in a supercritical state or in a liquid state;
   subsequently introducing a rinse solution into the process chamber, wherein the rinse solution comprises the fluid in a supercritical state or in a liquid state; and
   introducing a chemistry into the process chamber at least partially during both of the steps of introducing the etch solution and introducing the rinse solution, wherein the chemistry is chemically configured to modify the dissolved etch byproducts within an ambient environment of the microelectronic topography such that the dissolved etch byproducts are inhibited from precipitating onto the microelectronic topography, and wherein the chemistry is selected from a group consisting of hydroxysilanes, thionyl chlorides and isocyanates.

20. The method of claim 19, wherein the step of selectively etching the layer produces etch byproducts comprising hydroxy silane groups.

* * * * *